(12) United States Patent
Bowler et al.

(10) Patent No.: US 8,982,270 B2
(45) Date of Patent: Mar. 17, 2015

(54) DEFORMABLE FOCAL PLANE ARRAY

(75) Inventors: Dennis P. Bowler, Sudbury, MA (US);
Raymond J. Silva, Saugus, MA (US);
Gerard A. Esposito, Chelmsford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 140 days.

(21) Appl. No.: 13/604,655

(22) Filed: Sep. 6, 2012

(65) Prior Publication Data

US 2013/0063649 A1    Mar. 14, 2013

Related U.S. Application Data

(60) Provisional application No. 61/532,641, filed on Sep. 9, 2011.

(51) Int. Cl.
| | |
|---|---|
| *H04N 5/232* | (2006.01) |
| *H04N 5/335* | (2011.01) |
| *H01L 27/00* | (2006.01) |
| *H04N 5/369* | (2011.01) |
| *H01L 27/146* | (2006.01) |

(52) U.S. Cl.
CPC ........ *H04N 5/3696* (2013.01); *H01L 27/14601* (2013.01)
USPC ........ 348/345; 348/294; 250/208.1; 438/457; 438/459; 257/432

(58) Field of Classification Search
CPC ........ H04H 5/232; H04H 5/335; H01L 27/00; H01L 21/30; H04R 23/00
USPC .......... 348/294, 315, 345; 438/69, FOR. 119, 438/457, 459, 977, FOR. 485, 974; 257/415, 117, 118, 419, 432, E21.53; 250/208.1
See application file for complete search history.

(56) References Cited

U.S. PATENT DOCUMENTS

| | | | |
|---|---|---|---|
| 6,285,400 B1 * | 9/2001 | Hokari | 348/374 |
| 6,765,617 B1 * | 7/2004 | Tangen et al. | 348/340 |
| 6,849,843 B2 * | 2/2005 | Ansorge et al. | 250/208.1 |
| 7,742,090 B2 * | 6/2010 | Street et al. | 348/294 |
| 2005/0109918 A1 * | 5/2005 | Nikzad et al. | 250/208.1 |
| 2008/0225420 A1 * | 9/2008 | Barrows et al. | 359/850 |
| 2008/0237443 A1 * | 10/2008 | Oliver et al. | 250/200 |

* cited by examiner

*Primary Examiner* — Tuan Ho
*Assistant Examiner* — Marly Camargo
(74) *Attorney, Agent, or Firm* — Prakash Nama; Daniel J. Long

(57) ABSTRACT

A deformable focal plane array (DFPA) for imaging systems is disclosed. In one embodiment, the DFPA includes a detection circuitry on one side. For example, the thickness of the DFPA is in a range of about 5 to 40 microns. In one exemplary embodiment, the DFPA when warped to a desired shape provides a substantially wider field of view (FOV) than a flat focal plane array (FPA).

17 Claims, 5 Drawing Sheets

DEFORMABLE FOCAL PLANE ARRAY

CROSS-REFERENCE TO RELATED APPLICATION

This Application claims rights under 35 USC §119(e) from U.S. Application 61/532,641 filed Sep. 9, 2011, the contents of which are incorporated herein by reference.

BACKGROUND OF THE INVENTION

1. Field of Invention

The present application relates to focal plane arrays (FPAs) and more particularly to deformable focal plane arrays (DFPAs).

2. Brief Description of Related Art

Focal plane arrays (FPAs) are critical components of many modern imaging systems. A vast majority of FPA's are used for traditional, narrow field of view (FOV) applications, such as cell phone cameras, and accordingly, substantially all available FPAs have flat focal planes and are designed to better focus on such narrow FOVs. Typically, each pixel in the FPA will have a limited FOV, of about few degrees, and many high-performance surveillance systems requiring 60-180 degrees of FOV rely on a large number of FPAs to create a composite, wide FOV, high-resolution image. Unfortunately, because of the narrow FOV design, using standard lenses cause much of the area viewed by such wide FOV systems to be either severely out of focus or invisible on the flat focal planes of available FPA's.

The traditional solution to this problem is to create a highly complex telecentric lens to direct the light from all directions onto the flat focal plane to obtain a very wide FOV. However, this can increase lens complexity by requiring double or more the number of elements of a typical standard lens. Such increased complexity severely increases production times, costs, and loss rates. All of these disadvantages are multiplied by the number of lenses in the system, making wide FOV systems highly expensive and difficult to make for low cost and high volume applications, such as the cell phone cameras.

SUMMARY OF THE INVENTION

A deformable focal plane array (DFPA) is disclosed. According to one aspect of the present subject matter, a method for making the DFPA includes thinning a commercially available flat focal plane array (FPA) into the DFPA. Further, the method includes warping the DFPA into a desired shape, such as spherical, hemispherical, parabolic, elliptical, rectangular, conical, convex, concave, or any other shape that accommodates optical distortions by matching an image plane shape.

According to another aspect of the present subject matter, a method of manufacturing the DFPA includes obtaining a commercially available flat solid-state FPA having a detector circuitry on a first side. Further, the method includes thinning the obtained flat solid-state FPA by removing a portion of the flat solid-state FPA on a second side, that is disposed across from the first side, resulting in the DFPA. Furthermore, the method includes warping the DFPA into a desired shape.

According to yet another aspect of the present subject matter, the DFPA includes the detection circuitry on one side. For example, the thickness of the DFPA is in a range of about 5 to 40 microns. In one embodiment, the DFPA when warped to the desired shape provides a substantially wider field of view (FOV) than the flat FPA.

According to an aspect of the present subject matter, a digital camera system includes a simplified lens system and the DFPA warped to the desired shape to form a curved FPA. Further, the DFPA is configured to capture a substantially focused image including a wider FOV coming from the simplified lens system.

According to another aspect of the present subject matter, a digital camera includes the DFPA warped to the desired shape and positioned to capture the substantially focused image throughout the wider FOV.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design.

The terms "digital camera system" and "digital camera" are used interchangeably throughout the document.

Figure 1:
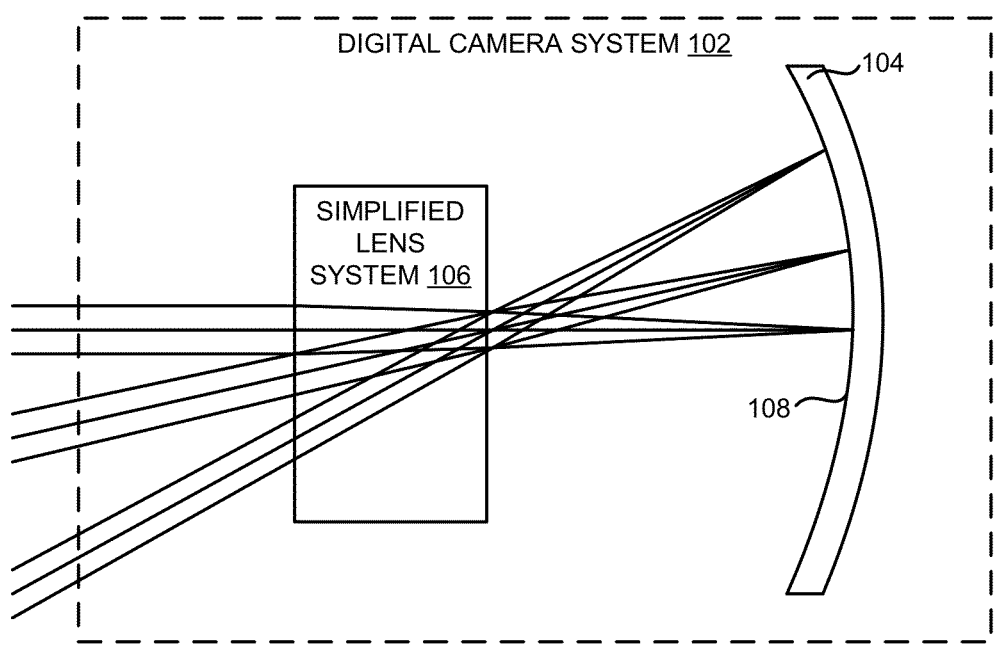
FIG. 1 is a schematic illustration of a deformable focal plane array (DFPA) for a digital camera system, according to an embodiment of the present subject matter.

FIG. 1 is a schematic illustration 100 of a deformable focal plane array (DFPA) 104 for a digital camera system 102, according to an embodiment of the present subject matter. As shown in FIG. 1, the digital camera system 102 includes the DFPA 104 warped to a desired shape to form a curved focal plane array (FPA) and a simplified lens system 106. For example, the desired shape is spherical, hemispherical, parabolic, elliptical, rectangular, conical, convex, concave, or any other shape that accommodates optical distortions by matching an image plane shape. For example, the digital camera system 102 includes a visible color camera, an infrared (IR) imaging camera and the like. In one exemplary implementation, the DFPA 104 includes a detection circuitry on one side 108. Further, the simplified lens system 106 is disposed in front of the DFPA 104. The DFPA 104 is front illuminated or back illuminated. In one embodiment, the DFPA 104 is configured to capture a substantially focused image including a wider field of view (FOV) coming from the simplified lens system 106. In another embodiment, the DFPA 104 is positioned to capture the substantially focused image throughout the wider FOV. For example, the wider FOV is in a range of about 10 degrees to 180 degrees of FOV.

Figure 2A:
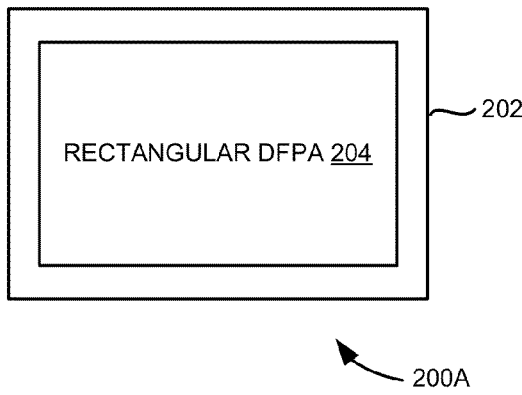
FIGS. 2A-2C are schematics that illustrate wrapping a rectangular DFPA onto a sphere to form a stretched rectangular DFPA and then to an ellipse shaped DFPA, according to an embodiment of the present subject matter.
Figure 2B:
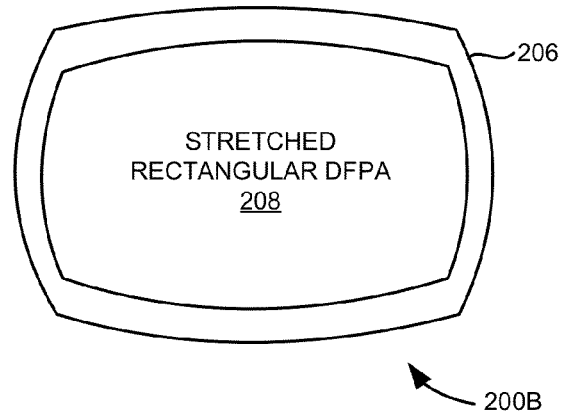
Figure 2C:
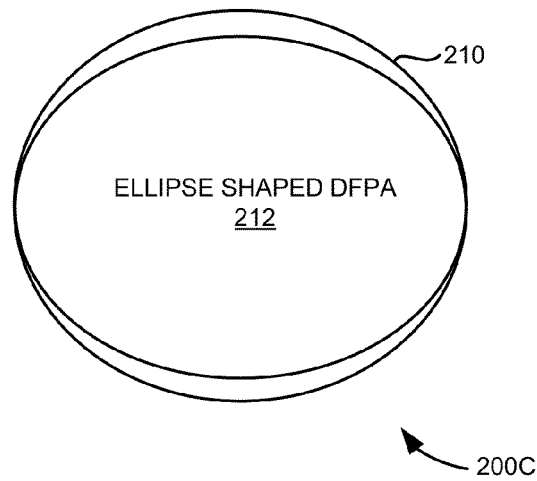

Referring now to FIGS. 2A-2C, which are schematics 200A-200C that illustrate wrapping a rectangular DFPA 204 onto a sphere 206 to form a stretched rectangular DFPA 208 and then to an ellipse shaped DFPA 212, according to an embodiment of the present subject matter. Particularly, FIG. 2A illustrates the rectangular DFPA 204 wrapped onto a rectangle 202. Further, FIG. 2B illustrates wrapping the rectangular DFPA 204 onto the sphere 206 to form the stretched rectangular DFPA 208. Furthermore, FIG. 2C illustrates wrapping the stretched rectangular DFPA 208 onto a sphere 210 to form the ellipse shaped DFPA 212.

Figure 3:
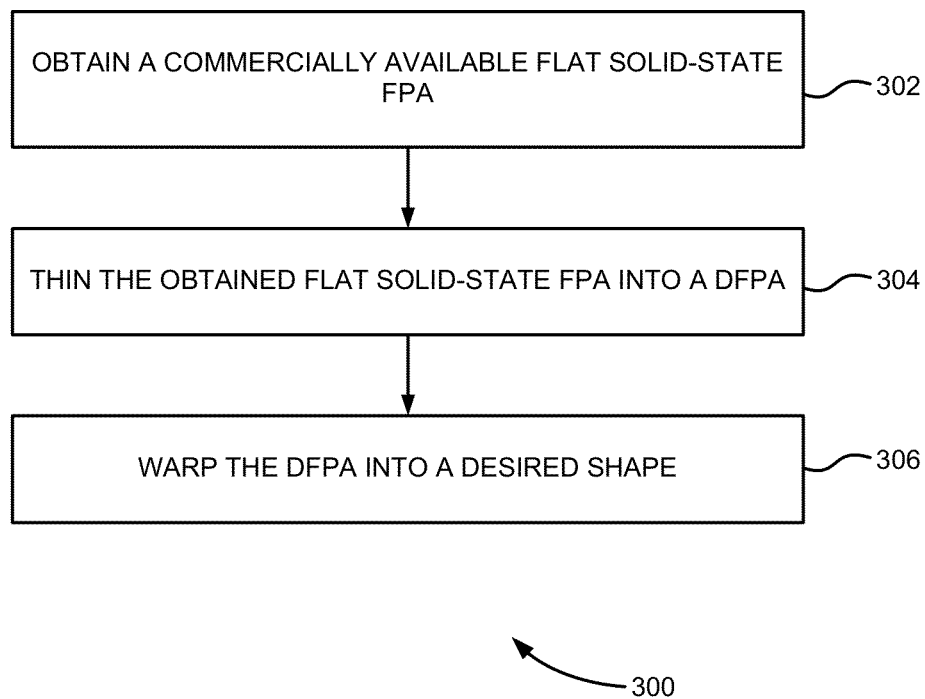
FIG. 3 illustrates an example flowchart of a method for manufacturing the DFPA, such as those shown in FIGS. 1 and 2A-2C.

Referring now to FIG. 3, which is an example flowchart 300 that illustrates a method for manufacturing a DFPA, such as those shown in FIGS. 1 and 2A-2C. At block 302, a commercially available flat solid-state FPA having a detector circuitry on a first side is obtained. At block 304, the obtained flat solid-state FPA is thinned by removing a portion of the flat solid-state FPA on a second side, that is disposed across from the first side, resulting in the DFPA. For example, the thickness of the DFPA is in a range of about 5 microns to 40 microns. For example, the DFPA is a front illuminated DFPA or a back illuminated DFPA. At block 306, the DFPA is warped into a desired shape. For example, the desired shape is spherical, hemispherical, parabolic, elliptical, rectangular, convex, concave, or any other shape that accommodates optical distortions by matching an image plane shape.

Figure 4:
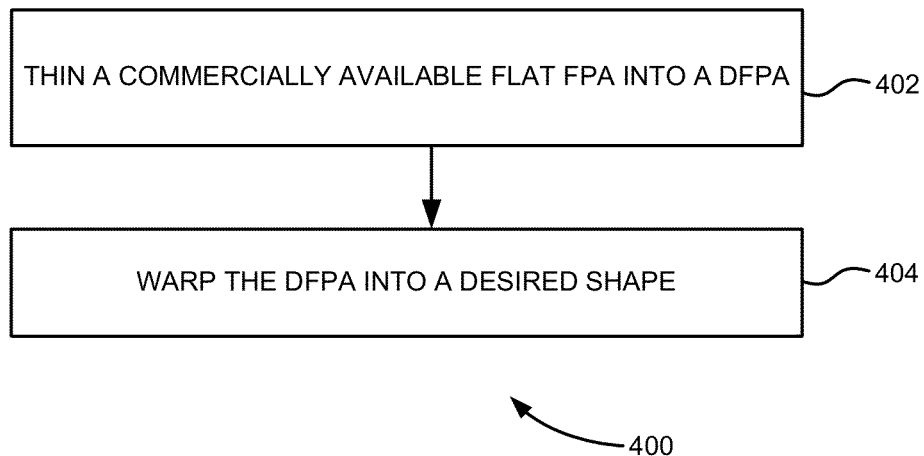
FIG. 4 illustrates an example flowchart of a method for making the DFPA, such as those shown in FIGS. 1 and 2A-2C.

Referring now to FIG. 4, which is an example flowchart 400 that illustrates a method for making a DFPA, such as those shown in FIGS. 1 and 2A-2C. At block 402, a commercially available flat FPA is thinned into the DFPA. For example, the thickness of the DFPA is in a range of about 5 microns to 40 microns. Exemplary flat FPA includes a flat solid-state FPA. At block 404, the DFPA is warped into a desired shape, such as spherical, hemispherical, parabolic, elliptical, rectangular, conical, convex, concave, or any other shape that accommodates optical distortions by matching an image plane shape. In one embodiment, the DFPA is warped into the desired shape by applying a vacuum. In one exemplary embodiment, the warped DFPA is configured to have a substantially wider FOV than the flat FPA. For example, the substantially wider FOV is in a range of about 10 degrees to 180 degrees of FOV. Deforming the FPA, similar to the effect of a telecentric lens, allows the FPA to be positioned such that light from the entire area viewed by a simple wide FOV lens is oriented directly onto the focal plane and thereby produces the focused image over the entire wide FOV of the system. In fact, this method is so effective that standard imaging lenses could be reduced to even simpler spherical lenses, providing even more cost savings.

Figure 5A:
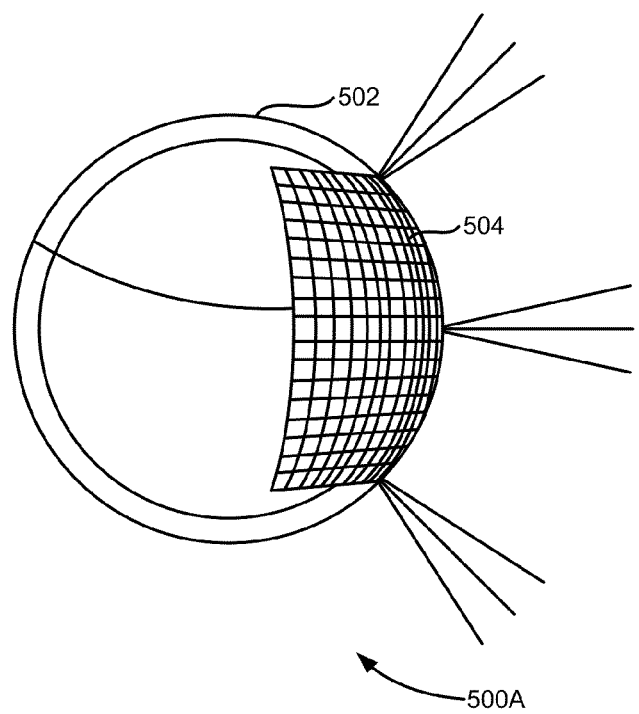
FIGS. 5A-5B illustrate a convex and concave implementation of the DFPA, respectively, such as those shown in FIGS. 1 and 2A-2C.
Figure 5B:
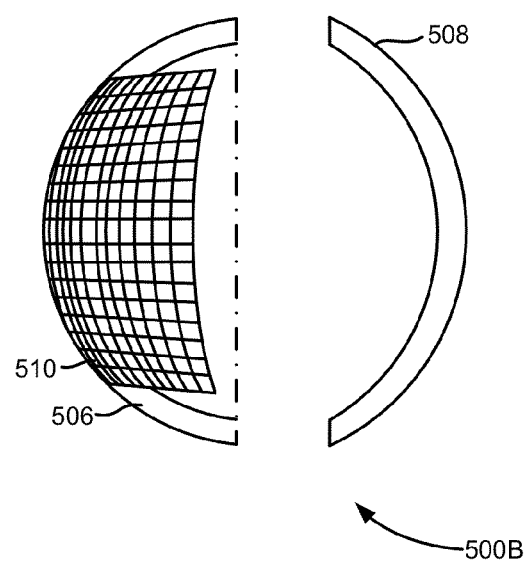

FIGS. 5A-5B illustrate a convex and concave implementation 500A and 500B of the DFPA, respectively, such as those shown in FIGS. 1 and 2A-2C. Particularly, FIG. 5A illustrates DFPAs on a convex surface 502. Further, rectangular features 504 illustrate pixels on the DFPAs. In one embodiment, the DFPAs on the convex surface 502 uses embedded microlenses to an image wide FOV. Particularly, FIG. 5B illustrates DFPAs on the concave surface 506 and a wide FOV lens 508. Further, rectangular features 510 illustrate pixels on the DFPAs.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated.

It is understood that various omission and substitutions of equivalents are contemplated as circumstance may suggest or render expedient, but such are intended to cover the application or implementation without departing from the spirit or scope of the claims of the present disclosure.

What is claimed is:

1. A method for making a deformable focal plane array (DFPA), comprising:
    thinning a commercially available flat focal plane array (FPA) into the DFPA; and
    warping the DFPA into a desired shape selected from the group consisting of spherical, hemispherical, parabolic, elliptical, rectangular, and conical, wherein warping the DFPA into the desired shape comprises:
        warping the DFPA into the desired shape by applying a vacuum.

2. The method of claim 1, wherein the thickness of the DFPA is in a range of about 5 microns to 40 microns.

3. The method of claim 1, wherein the warped DFPA is configured to have a substantially wider field of view (FOV) than the flat FPA.

4. The method of claim 3, wherein the substantially wider FOV is in a range of about 10 degrees to 180 degrees of FOV.

5. The method of claim 1, wherein the flat FPA is a flat solid-state FPA.

6. A method of manufacturing a deformable focal plane array (DFPA), comprising:
    obtaining a commercially available flat solid-state focal plane array (FPA) having a obtaining detector circuitry on a first side;
    thinning the obtained flat solid-state FPA by removing a portion of the flat solid-state FPA on a second side, that is disposed across from the first side, resulting in the DFPA; and
    warping the DFPA into a desired shape selected from the group consisting of spherical, hemispherical, parabolic, elliptical, rectangular, and conical, wherein warping the DFPA into the desired shape comprises:
        warping the DFPA into the desired shape by applying a vacuum.

7. The method of claim 6, wherein the thickness of the DFPA is in a range of about 5 microns to 40 microns.

8. The method of claim 6, wherein the DFPA is a front illuminated DFPA or a back illuminated DFPA.

9. A deformable focal plane array (DFPA), comprising:
    a detection circuitry on one side, wherein the thickness of the DFPA is in a range of about 5 to 40 microns and wherein the DFPA when warped to a desired shape provides a substantially wider field of view (FOV) than a flat focal plane array (FPA), wherein the DFPA is warped into the desired shape selected from the group consisting of spherical, hemispherical, parabolic, elliptical, rectangular, and conical, and wherein the DFPA is warped into the desired shape by applying a vacuum.

10. The DFPA of claim 9, wherein the substantially wider FOV is in a range of about 10 degrees to 180 degrees of FONT.

11. A digital camera system, comprising:
    a simplified lens system; and
    a deformable focal plane array (DFPA) warped to a desired shape to form a curved focal plane array (FPA) and configured to capture a substantially focused image including a wider field of view (FOV) coming from the simplified lens system, wherein the DFPA is warped into the desired shape selected from the group consisting of spherical, hemispherical, parabolic, elliptical, rectangular, and conical, and wherein the DFPA is warped into the desired shape by applying a vacuum.

12. The digital camera system of claim 11, wherein the wider FOV is in a range of about 10 degrees to 180 degrees of FOV.

13. The digital camera system of claim 11, wherein the simplified lens system is disposed in front of the DFPA.

14. The digital camera system of claim 11, wherein the DFPA is front illuminated or back illuminated.

15. A digital camera, comprising:
    a deformable focal plane array (DFPA) warped to a desired shape and positioned to capture a substantially focused image throughout a wider field of view (FOV), wherein the DFPA is warped into the desired shape selected from the group consisting of spherical, hemispherical, parabolic, elliptical, rectangular, and conical, and wherein the DFPA is warped into the desired shape by applying a vacuum.

16. The digital camera of claim 15, wherein the wider FOV is in a range of about 10 degrees to 180 degrees of FOV.

17. The digital camera of claim 15, wherein the digital camera is selected from the group consisting of a visible color camera and an infrared (IR) imaging camera.

\* \* \* \* \*